(12) United States Patent
Kwon et al.

(10) Patent No.: US 8,828,247 B2
(45) Date of Patent: Sep. 9, 2014

(54) METHOD OF MANUFACTURING PRINTED CIRCUIT BOARD HAVING VIAS AND FINE CIRCUIT AND PRINTED CIRCUIT BOARD MANUFACTURED USING THE SAME

(75) Inventors: Soon Chul Kwon, Seongnam-si (KR); Sang Min Lee, Seongnam-si (KR)

(73) Assignee: MDS Co., Ltd., Changwon-Si (KR)

( * ) Notice: Subject to any disclaimer, the term of this patent is extended or adjusted under 35 U.S.C. 154(b) by 0 days.

(21) Appl. No.: 13/589,635

(22) Filed: Aug. 20, 2012

(65) Prior Publication Data

US 2013/0068510 A1    Mar. 21, 2013

(30) Foreign Application Priority Data

Sep. 21, 2011  (KR) .................. 10-2011-0095269

(51) Int. Cl.
*H01B 13/00*    (2006.01)

(52) U.S. Cl.
USPC ................. 216/19; 216/13; 216/17; 216/39; 438/694

(58) Field of Classification Search
None
See application file for complete search history.

(56) References Cited

U.S. PATENT DOCUMENTS

| 5,959,256 A * | 9/1999 | Saida et al. ................ 174/258 |
| 2009/0020315 A1 * | 1/2009 | Dutton ........................ 174/250 |
| 2009/0200265 A1 * | 8/2009 | Chang ........................... 216/39 |

FOREIGN PATENT DOCUMENTS

| KR | 100402454 A | 10/2003 |
| KR | 1020060006125 A | 1/2006 |
| KR | 1020070037859 A | 4/2007 |
| KR | 1020100138209 A | 12/2010 |
| KR | 1020110030160 A | 3/2011 |
| KR | 1020110042977 A | 4/2011 |

* cited by examiner

*Primary Examiner* — Lan Vinh
*Assistant Examiner* — Jiong-Ping Lu
(74) *Attorney, Agent, or Firm* — Sughrue Mion, PLLC

(57) ABSTRACT

Provided is a method of manufacturing a circuit which includes: (a) providing a substrate made of a conductive material; (b) etching a first surface of the substrate excluding a region in which at least one via is to be formed; (c) etching a region of the etched first surface of the substrate in which an insulated portion of a first circuit is to be formed; (d) stacking a first insulation layer in spaces formed by the etching performed in operations (b) and (c); and (e) grinding a second surface of the substrate to expose the first insulation layer outward along with the first circuit, thereby forming a circuit board.

17 Claims, 13 Drawing Sheets

METHOD OF MANUFACTURING PRINTED CIRCUIT BOARD HAVING VIAS AND FINE CIRCUIT AND PRINTED CIRCUIT BOARD MANUFACTURED USING THE SAME

CROSS-REFERENCE TO RELATED PATENT APPLICATION

This application claims priority from Korean Patent Application No. 10-2011-0095269 filed on Sep. 21, 2011 in the Korean Intellectual Property Office, the disclosure of which is incorporated here in its entirety by reference.

BACKGROUND

1. Field

Methods and apparatuses consistent with exemplary embodiments relate to a printed circuit board (PCB), and more particularly, to a PCB having vias and a fine circuit, which are integrally formed, and a PCB manufactured using the same.

2. Description of the Related Art

In recent years, various technologies related to electronic devices and circuit boards have been developed with rapid growth of the electronics industry. In particular, a PCB has exhibited a fine pitch and become small and thin according to the trend of electronic products which are lightweight, thin, short and small.

According to the technical trend as described above, inter-layer conduction vias and a fine circuit are integrally formed using a laser trench process method or an imprint method, which are disclosed in Korean Patent Registration No. 10-1109323.

In the manufacturing methods as described above and shown in FIG. 1, a pattern is formed (S10), non-electrolytic copper plating (S20) and electrolytic copper plating (S30) are carried out, and a planarization process (S40) is carried out to form vias and a fine circuit at a PCB.

Hereinafter, the steps of the respective methods according to the related art will be described in detail.

FIGS. 2A-2D show a related art LTP method of manufacturing a PCB having vias and a fine circuit, which are integrally formed, and FIGS. 3A-3D show a related art imprint method of manufacturing a PCB having vias and a fine circuit, which are integrally formed.

In the LTP method, as shown in FIGS. 2A-2D, a surface of a dielectric layer at which a circuit pattern is to be formed is removed using a fine circuit forming device, such as an excimer laser, to form a pattern (FIG. 2A), copper plating (FIGS. 2B and 2C) are carried out to form a metal layer, and a planarization process (FIG. 2D) is carried out to complete a circuit.

In the imprint method, as shown in FIGS. 3A-3D, a circuit pattern to be formed at a substrate is formed at a mold in an embossed state, and the embossed mold is pressed against a dielectric layer of the substrate to transfer the circuit (FIG. 3A). Subsequently, copper plating (FIGS. 3B and 3C) is carried out to form a metal layer, and a planarization process (FIG. 3D) is carried out to complete a circuit.

However, in the related art LTP method of forming the vias and the fine circuit at a PCB in the integrated manner, a portion at which a fine circuit pattern is to be formed is removed, which increases a processing time for a large-sized PCB. In the related art imprint method of forming the vias and the fine circuit at a PCB in the integrated manner, a high-priced mold having vias and a fine circuit formed in an embossed state, which increases manufacturing and processing costs. Also, the lifespan of the high-priced mold may be shortened due to high pressure applied to the mold. Furthermore, in a case in which air is trapped in a rugged portion of the mold, defects may occur. Also, in both the LTP method and the imprint method, a copper plating process is required to form a metal layer, which may result in copper plating defects, thereby restricting productivity.

SUMMARY

Exemplary embodiments are provided to address the above problems and provide a method of manufacturing a PCB having vias and a fine circuit, which are integrally formed, without a Cu plating process to form an additional metal layer.

In accordance with an aspect of an exemplary embodiment, there is provided a method of manufacturing a circuit board, the method including: (a) providing a substrate made of a conductive material; (b) etching a first surface of the substrate excluding a region in which at least one via is to be formed; (c) etching a region of the etched first surface of the substrate in which an insulated portion of a first circuit pattern is to be formed; (d) stacking a first insulation layer in spaces formed by the etching performed in operations (b) and (c); and (e) grinding a second surface of the substrate to expose the first insulation layer outward along with the first circuit pattern, thereby forming a circuit board.

Operation (b) may include (b1) applying a first photosensitive resist layer to the first surface of the substrate; (b2) exposing and developing the first photosensitive resist layer in which the at least one via is to be formed; and (b3) etching the first surface using the first photosensitive resist layer.

Operation (b) may further include (b4) removing the first photosensitive resist layer.

Operation (c) may include (c1) applying a second photosensitive resist layer to the etched first surface of the substrate; (c2) exposing and developing the second photosensitive resist layer in which the first circuit pattern is to be formed; and (c3) etching the etched first surface using the second photosensitive resist layer.

At operation (c1), the second photosensitive resist layer may be formed of a dry film resist (DFR) or an electric deposit photo resist (EDPR).

At operation (c2), the second photosensitive resist layer may be exposed using a laser direct image (LDI).

Operation (c) may further include (c4) removing the second photosensitive resist layer.

At operation (d), the first dielectric layer may be formed of a prepreg.

The method of manufacturing the circuit board may further include (f) forming a second circuit pattern on the first surface of the substrate where the first insulation layer is stacked in the spaces formed by the etching performed in operations (b) and (c).

At operation (f), the second circuit pattern may be formed using any one selected from a group consisting of a tenting process, a panel/pattern process, a semi additive process, a modified semi additive process, an advanced modified semi additive process, and a full additive process.

Operation (f) may include fully forming a fifth photosensitive resist over the side of the substrate at which the first circuit pattern is formed when the second circuit pattern is formed.

In the method of manufacturing the circuit board, the circuit board and at least one another circuit board having the same structure may be bonded to form a multi layer circuit board.

The method of manufacturing the circuit board may further include performing surface protection treatment with respect to at least one of the first surface where the first insulation layer is stacked in the spaces formed by the etching performed in operations (b) and (c), and the second surface.

The step of performing surface protection treatment may include forming a patterned photo solder resist (PSR) protection layer to perform the surface protection treatment.

In accordance with an aspect of another exemplary embodiment, there is provided a method of manufacturing a circuit board, the method including: (a) providing a substrate made of a conductive material; (b) etching a first surface of the substrate excluding a region in which at least one via is to be formed; (c) etching a region of the etched first surface of the substrate in which an insulated portion of a first circuit pattern is to be formed; (d) stacking a first insulation layer in spaces formed by the etching performed in operations (b) and (c); (e) stacking a first conductive layer on the first surface of the substrate after operation (d); (f) etching the first and second surfaces of the substrate after operation (e) so that the first insulation layer is exposed outward along with the first circuit pattern; and (g) forming a second circuit pattern at the first conductive layer.

At operation (g), the second circuit pattern may be formed using any one selected from a group consisting of a tenting process, a panel/pattern process, a semi additive process, a modified semi additive process, an advanced modified semi additive process, and a full additive process.

Operation (g) may include fully forming a fifth photosensitive resist on the first surface of the substrate at which the first circuit pattern is formed before the second circuit pattern is formed.

In accordance with a further aspect of an exemplary embodiment, there is provided a PCB manufactured using the method as described above.

BRIEF DESCRIPTION OF THE DRAWINGS

The above and other aspects will be more clearly understood from the following detailed description taken in conjunction with the accompanying drawings, in which.

DETAILED DESCRIPTION

Hereinafter, exemplary embodiments will be described in detail with reference to the accompanying drawings so that a person having ordinary skill in the art to which the present inventive concept pertains can easily realize the exemplary embodiments. It should be noted, however, that these embodiments are only for illustrative purposes and the scope of the inventive concept is not limited by the illustrated embodiments. Also, parts having no relation to the description of the exemplary embodiments are omitted from the drawings for clear description of the inventive concept, and the same reference numbers will be used throughout this specification to refer to the same or like parts.

First Exemplary Embodiment

FIGS. 4A-4I and FIG. 5 illustrate a method of manufacturing a PCB having vias and a fine circuit according to a first exemplary embodiment.

Figure 5:
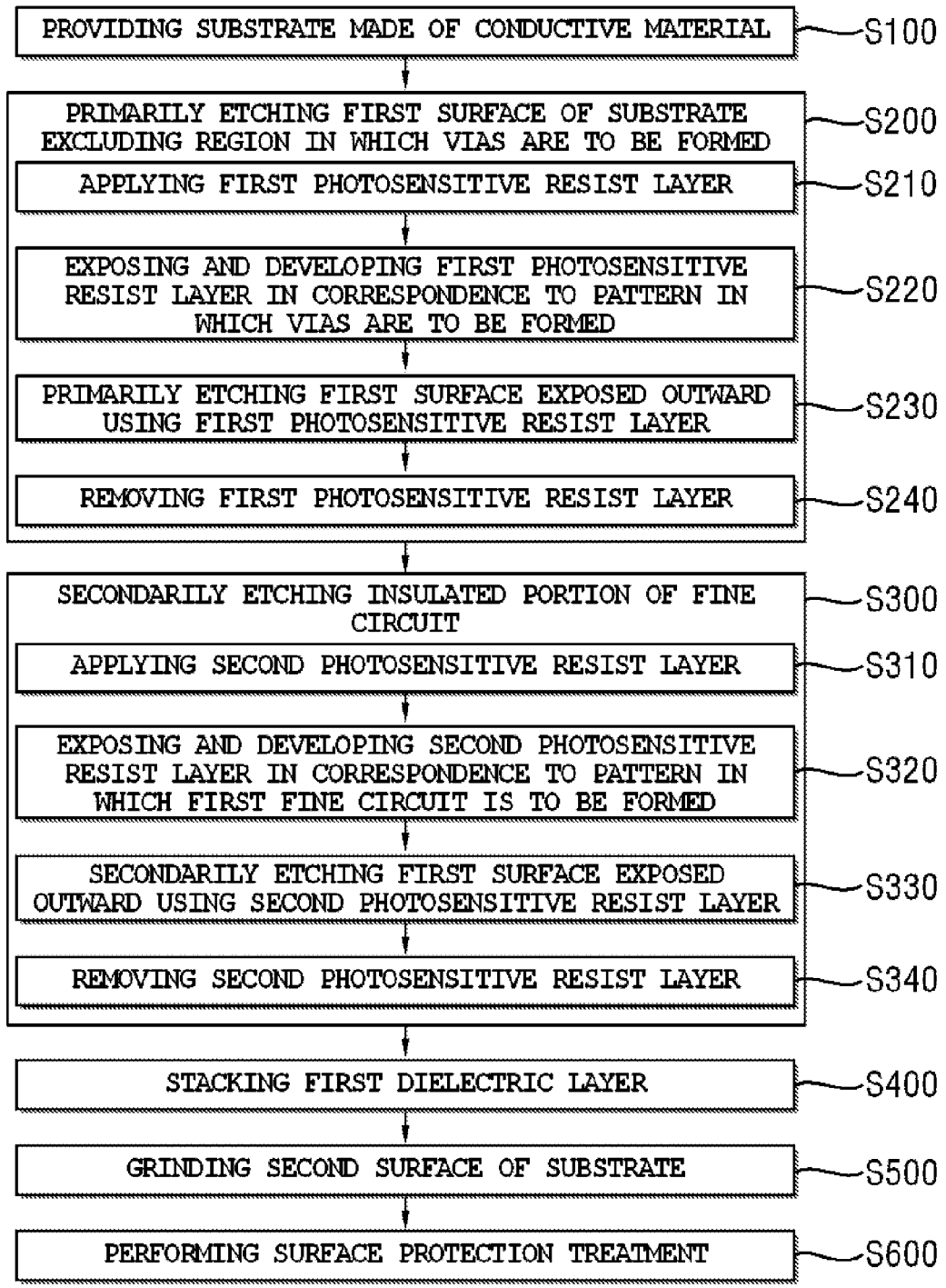
FIG. 5 is a flow chart showing the method of FIG. 4.

As shown in FIG. 5, the method of manufacturing the PCB having the vias and the fine circuit according to the first exemplary embodiment includes operations as follows. A substrate made of a conductive material is provided (S100). A first surface of the substrate excluding a region in which vias are to be formed is etched (S200). In the etched region, another etching is performed on a region which is to form an insulated portion of a first fine circuit pattern (S300). A dielectric layer is stacked in spaces formed by the selective etching in operations S200 and S300 (S400). A second surface of the substrate, which is opposite to the first surface, is grinded to expose the dielectric layer, stacked in spaces formed by the selective etching in operations S200 and S300, outward (S500). Surface protection treatment is performed with respect to at least one of the first surface of the substrate on which the dielectric layer is stacked and the grinded second surface of the substrate (S600).

Hereinafter, the above method will be described in detail with reference to FIGS. 4A-4I and 5.

As shown in FIG. 5, the method of manufacturing the PCB having the vias and the fine circuit according to the first exemplary embodiment begins with providing a substrate made of a conductive material (S100).

Figure 1:
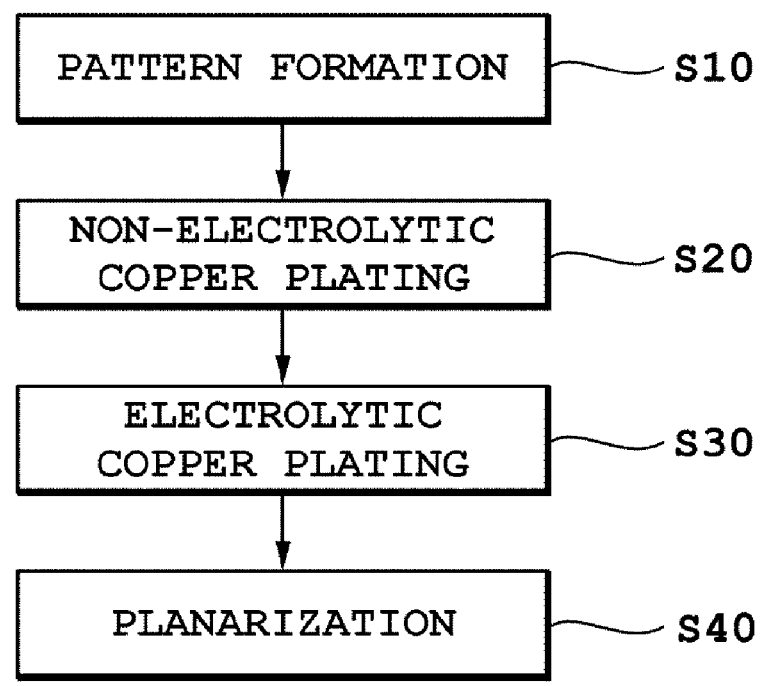
FIG. 1 is a flow chart showing a related art method of manufacturing a PCB having vias and a fine circuit, which are integrally formed.
Figure 2A:
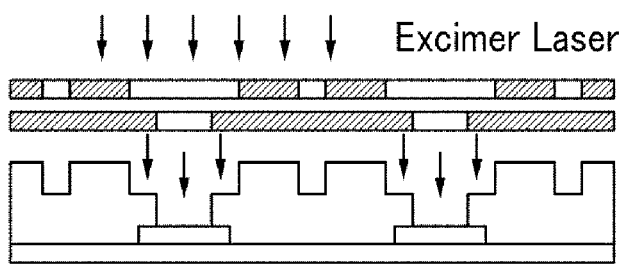
FIGS. 2A-2D illustrate a related art method of manufacturing a PCB having vias and a fine circuit, which are integrally formed, based on a laser trench process (LTP)
Figure 2B:
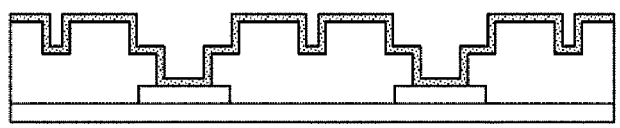
Figure 2C:
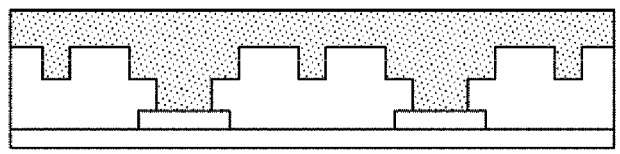
Figure 2D:
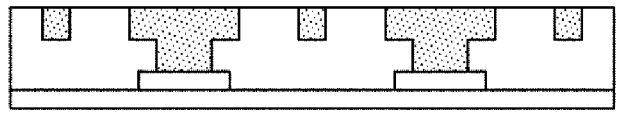
Figure 3A:
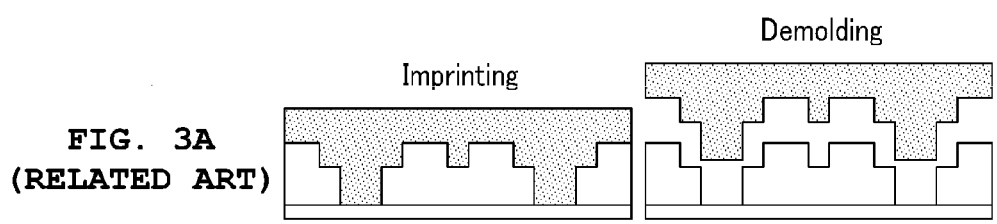
FIGS. 3A-3D illustrate a related art method of manufacturing a PCB having vias and a fine circuit, which are integrally formed, based on an imprint method.
Figure 3B:
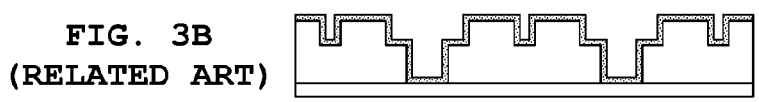
Figure 3C:
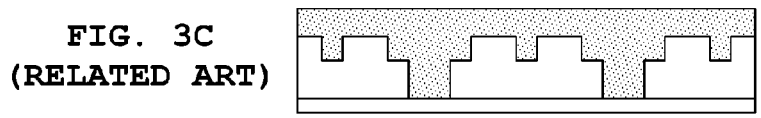
Figure 3D:
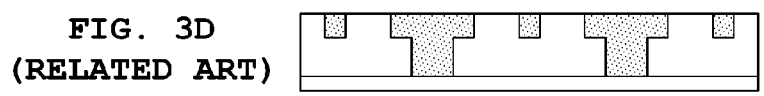
Figure 4A:
FIGS. 4A-4I illustrate a method of manufacturing a PCB having vias and a fine circuit according to an exemplary embodiment.

Generally, vias and a fine circuit are formed using a substrate made of an insulative material. As shown in FIG. 4A, however, a substrate 100 made of a conductive material is used to form vias and a fine circuit. Consequently, the manufacturing method according to the first exemplary embodiment may omit a copper plating process, which is indispensable in the related art. The substrate 100 may be made of a conductive material, such as gold (Au), silver (Ag) or copper (Cu). Preferably but not necessarily, the substrate 100 is made of Cu in terms of conductivity and productivity.

Once the substrate 100 is provided, a surface of the substrate 100 is primarily etched except a region in the surface in which vias 101 are to be formed so that the vias 101 protrude in a bulging shape and the other region in the surface is removed by etching (S200).

More specifically, the primary etching operation (S200) includes applying a first photosensitive resist layer 110 to a first surface of the substrate 100 (S210), exposing and developing the first photosensitive resist layer 110 corresponding to a pattern in which vias 101 are to be formed (S220), primarily etching the first surface exposed outward using the first photosensitive resist layer 110 (S230), and removing the remainder of the first photosensitive resist layer 110 after the primary etching (S240).

Figure 4B:
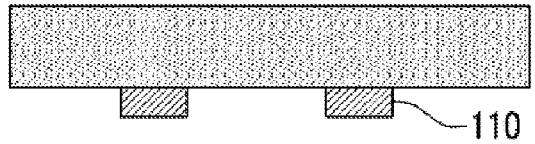
Figure 4C:

In reference to FIGS. 4B and 4C, after the substrate 100 is provided, and the first photosensitive resist layer 110 is applied to the first surface of the substrate 100, the first photosensitive resist layer 110 may be formed of a photosensitive resist, such as a dry film resist (DFR) or a liquid photo resist (LPR). The first photosensitive resist layer 110 is patterned by exposing the first photosensitive resist layer 110 using a mask pattern (not shown) corresponding to the pattern in which the vias 101 are to be formed or a laser direct image (LDI). Subsequently, the partially exposed first photosensitive resist layer 110 is developed using a developing solution to remove a positive portion of the first photosensitive resist layer 110, i.e. a portion of the first photosensitive resist layer 110 exposed by light, or a negative portion of the first photosensitive resist layer 110, i.e. a portion of the first photosensitive resist layer 110 not exposed by light. As a result, the first photosensitive resist layer 110 is patterned (FIG. 4B).

After the first photosensitive resist layer 110 is patterned, the first surface of the substrate 100 except the region in which the vias 101 are to be formed is exposed outward as one surface of the conductive substrate 100, and the outwardly exposed portion of the conductive substrate 100 is removed by etching. As a result, the substrate 100 is structure such that only the vias 101 protrude in a bulging shape (FIG. 4C). Subsequently, the first photosensitive resist layer 110 is removed by peeling.

In reference to FIG. 5, the next operation of the manufacturing method according to the first exemplary embodiment is secondarily etching a portion of the first surface of the substrate, i.e. the primarily etched surface of the substrate 100, corresponding to an insulated region of a first fine circuit pattern (S300).

More specifically, the secondary etching operation (S300) includes forming a second photosensitive resist layer 120 on the primarily etched surface of the substrate (S310), exposing and developing the second photosensitive resist layer 120 corresponding to the pattern in which the first fine circuit is to be formed (S320), secondary etching the first surface exposed outward through the second photosensitive resist layer 120 (S330), and removing the remainder of the second photosensitive resist layer 120 after the second etching (S340).

Figure 4D:
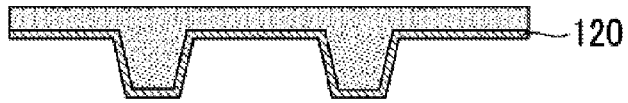
Figure 4E:
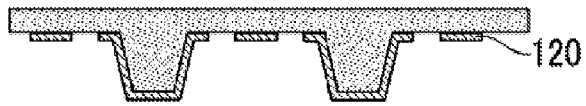
Figure 4F:

In reference to FIGS. 4D-4F, the secondary etching operation will be described as follows. First, the second photosensitive resist layer 120 is applied to the first surface of the substrate at which the vias 101 protrude by electrodeposition (FIG. 4D). The second photosensitive resist layer 120 may be formed of a photosensitive resist, such as a DFR or an LPR. Also, the second photosensitive resist layer 120 may be formed of an electric deposit photo resist (EDPR). In particular, when the EDPR is used, it is possible to uniformly apply the second photosensitive resist layer 120 to lateral sides of the respective protruding vias 101. Also, it is possible to adjust the thickness of the second photosensitive resist layer 120 through control of application voltage, temperature and time. Consequently, it is preferable, but not necessary, to apply the second photosensitive resist layer 120 to the substrate using the EDPR.

Next, exposure and developing processes (S320) of exposing and developing the second photosensitive resist layer 120 will be individually described as follows. The exposure process may be carried out using a mask pattern (not shown) or using the LDI process without an additional mask. In particular, the LDI process is a process for irradiating a laser to a desired portion based on data stored in a computer so that the desired portion can be exposed. The laser may be irradiated to the portion corresponding to the first fine circuit pattern so that the portion can be exposed. In particular, when the second photosensitive resist layer 120 is exposed using the LDI process, it is not necessary to provide an additional mask, to realize a fine circuit having high resolution at a high speed, and to prevent the occurrence of defects due to foreign matter on the mask after exposure. Consequently, it is preferable, but not necessary, to carry out exposure using the LDI process.

A subsequent process, i.e. the developing process, is carried out as follows. The second photosensitive resist layer 120 is developed, in the same manner as the method of forming the vias 101 using the first photosensitive resist layer 110, to remove a positive portion of the second photosensitive resist layer 120, i.e. a portion of the second photosensitive resist layer 120 exposed by light, or a negative portion of the second photosensitive resist layer 120, i.e. a portion of the second photosensitive resist layer 120 not exposed by light. As a result, the second photosensitive resist layer 120 is patterned (FIG. 4E).

After the second photosensitive resist layer 120 is patterned, a region corresponding to the insulated portion of the fine circuit pattern is exposed outward, and the exposed insulated portion of the fine circuit pattern is removed by the thickness of the fine circuit pattern at the minimum through etching. As a result, a portion corresponding to the first fine circuit pattern is formed at the substrate (FIG. 4F).

Subsequently, the remainder of the second photosensitive resist layer 120 is also removed by peeling after the patterning of the second photosensitive resist layer 120.

In reference to FIG. 5, a next operation of the manufacturing method according to the first exemplary embodiment is stacking a first dielectric layer 160 in spaces formed by the primary etching and the secondary etching (S400).

Figure 4G:
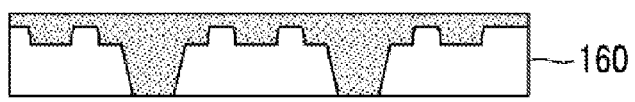
Figure 4H:
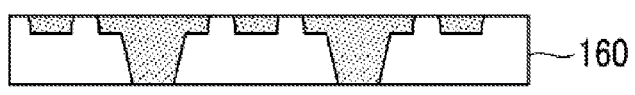
Figure 4I:
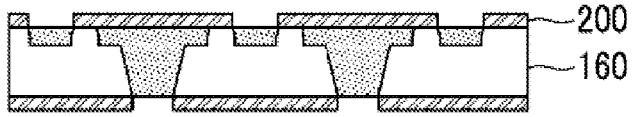

In reference to FIGS. 4G-4I, the first dielectric layer 160 is stacked in the space formed by the primary etching, which is not occupied by the vias 101, and the space corresponding to the insulated portion of the first fine circuit pattern, which is formed by the second etching. The first dielectric layer 160 is stacked to the height of each of the vias at the minimum to form a coreless board (see FIG. 4G).

It is preferable, but not necessary, to use a prepreg, which is formed in a half-hardened state by infiltrating a thermally curable resin into a glass fiber, as the first dielectric layer 160 in terms of heat resistance, copper film adhesion and high dielectric constant.

In reference to FIG. 5, a next operation of the manufacturing method according to the first exemplary embodiment is grinding the second surface of the substrate 100 to expose the insulated portion of the first fine circuit pattern formed by the first dielectric layer 160 outward (S500).

The second surface of the substrate 100, which is opposite to the first surface at which the first dielectric layer 160 is stacked, is fully etched. Alternatively, a planarization process may be carried out through chemical mechanical polishing or various mechanical grindings (jet scrub, buff grinding, ceramic grinding, etc.)

As a result of the planarization process, the first dielectric layer 160 filling the insulated portion of the first fine circuit pattern is exposed outward, and therefore, the first fine circuit pattern is formed at the second surface of the substrate in a state in which the first fine circuit pattern has a predetermined pattern (FIG. 4H).

A next step of the manufacturing method according to the first exemplary embodiment is performing surface protection treatment with respect to at least one of the first surface of the substrate on which the first dielectric layer 160 is stacked and the grinded second surface of the substrate 100 (S600).

The surface protection treatment is achieved by applying a photo solder resist (PSR) 200 to at least one of the first and second surfaces of the substrate 100, and exposing and developing the PSR to form a PSR protection layer in which the at least one of the first and second surfaces except a region to be soldered is patterned. The PSR pattern may be used as a plating resist so that plating is performed with respect to only a portion to be connected to another substrate or chip (see FIG. 4I).

Also, when PCBs, each of which is manufactured using the manufacturing method according to the first exemplary embodiment, are bonded to form a multi layer board, the surface of a circuit layer may be black oxide processed to increase interlayer contact force with the first dielectric layer 160, such as a prepreg.

Second Exemplary Embodiment

According to a second exemplary embodiment, there is provided a method of manufacturing a two layer PCB in which circuit patterns are formed at both surfaces of the PCB.

Figure 6A:
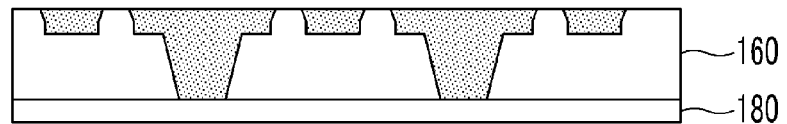
FIGS. 6A-6D illustrate a method of forming a second fine circuit of a two layer PCB having vias and a fine circuit according to another exemplary embodiment based on a subtractive method.
Figure 6B:
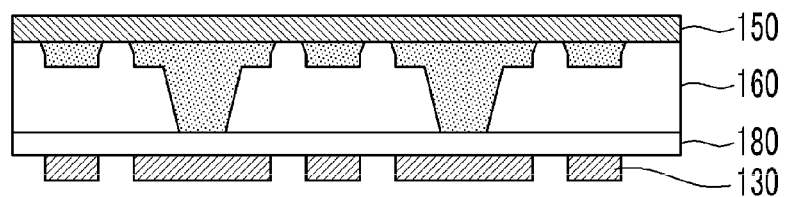
Figure 6C:
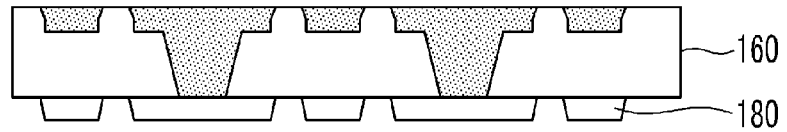
Figure 6D:
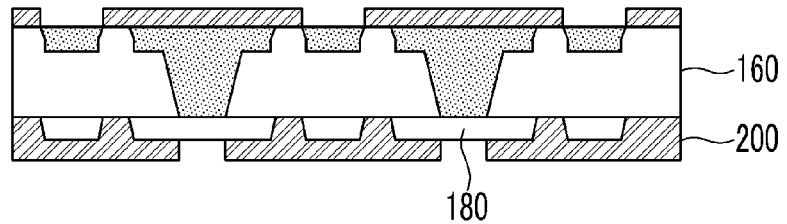
Figure 7A:
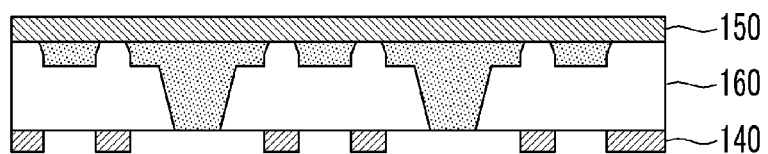
FIGS. 7A-7D illustrate a method of forming the second fine circuit of the PCB having the vias and the fine circuit according to another exemplary embodiment based on an additive method.
Figure 7B:
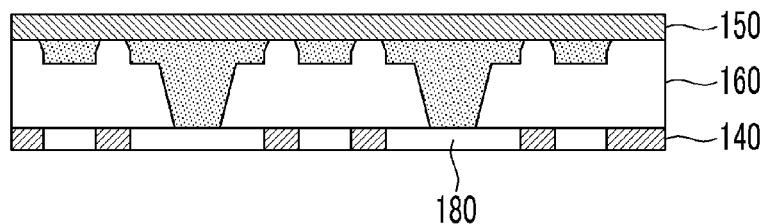
Figure 7C:
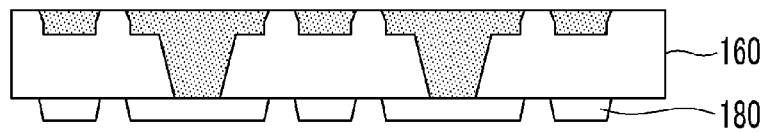
Figure 7D:
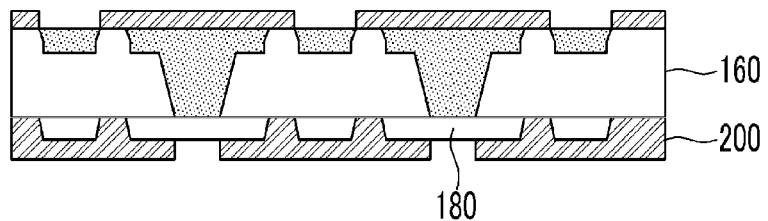
Figure 8:
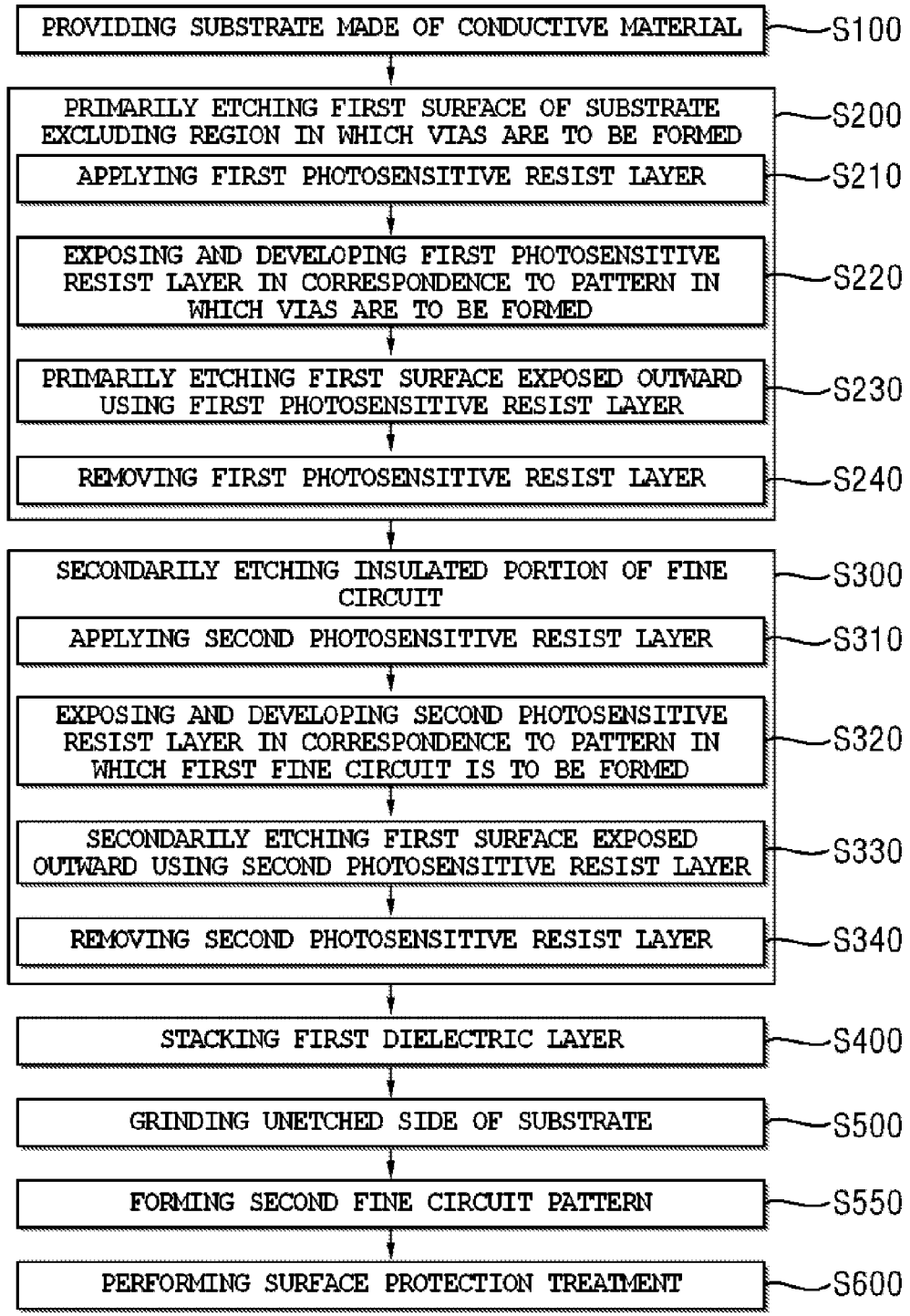
FIG. 8 is a flow chart showing the methods of FIGS. 6A-6D and 7A-7D.

FIGS. 6A-6D illustrate a method of forming another fine circuit pattern on a PCB having vias and a fine circuit formed in the first exemplary embodiment, according to the second exemplary embodiment based on a subtractive method, FIG. 7A-7D illustrate a method of forming another fine circuit pattern on the PCB having the vias and the fine circuit formed in the first exemplary embodiment, according to the second exemplary embodiment based on an additive method, and FIG. 8 is a flow chart showing the methods of FIGS. 6A-6D and 7A-7D.

The second fine circuit pattern may be formed using a subtractive method or an additive method.

The subtractive method is a method of etching a Cu film stacked plate except a portion at which a circuit pattern is to be formed to form the circuit pattern on a PCB. Examples of the subtractive method include a tenting process and a panel/pattern process.

The tenting process will be briefly described as follows. In the tenting process, non-electrolytic plating and electrolytic plating are sequentially carried out, a photosensitive resist is applied, and the photosensitive resist is exposed and developed to form a pattern. Subsequently, the patterned photosensitive resist is etched using a mask, and the photosensitive resist is removed by peeling. As a result, a circuit pattern is formed.

The panel/pattern process will be briefly described as follows. In the panel/pattern process, non-electrolytic plating and electrolytic plating are sequentially carried out, a photosensitive resist is applied, and the photosensitive resist is exposed and developed to form a pattern. Subsequently, electrolytic plating is carried out to obtain a plated portion having a pattern, and the photosensitive resist is removed by peeling and etching. As a result, a circuit pattern is formed.

The additive method is a method of forming a circuit pattern on a dielectric layer by plating. Examples of the additive method include a semi additive process (hereinafter, referred to as an "SAP"), a modified semi additive process (hereinafter, referred to as an "MSAP"), an advanced modified semi additive process (hereinafter, referred to as an "AMSAP"), and a full additive process (hereinafter, referred to as an "FAP").

The SAP, MASP and AMSAP are similar methods. The SAP, MASP and AMSAP will be briefly described as follows.

In the SAP, MASP and AMSAP, non-electrolytic plating is carried out, a photosensitive resist is applied, and the photosensitive resist is exposed and developed to form a pattern. Subsequently, electrolytic plating is carried out to obtain a plated portion having a pattern, and the photosensitive resist is removed by peeling and etching. As a result, a circuit pattern is formed.

The FAP will be briefly described as follows. In the FAP, a photosensitive resist is applied, and the photosensitive resist is exposed and developed to form a pattern. Subsequently, non-electrolytic plating is carried out with respect to the patterned photosensitive resist to form a circuit pattern.

As shown in FIG. 8, the method of manufacturing the two layer PCB by forming the second fine circuit pattern according to the second exemplary embodiment is identical to the manufacturing method according to the first exemplary embodiment up to operation S500 of grinding the second surface of the substrate 100 to expose the insulated portion of the first fine circuit pattern formed by the first dielectric layer 160 outward.

Thus, after operation S500, forming a second fine circuit pattern at the first surface of the substrate 100 on which the first dielectric layer 160 is stacked is carried out to form a two layer PCB (S550). The second fine circuit pattern may be formed using a subtractive method or an additive method.

In the subtractive method, as briefly shown in FIG. 6A-6D, a first conductive layer 180 is stacked on first surface of a single layer PCB where the first dielectric layer 16 is stacked according to the first exemplary embodiment at which the first fine circuit pattern is not formed (FIG. 6A), and the first conductive layer 180 is etched using a third photosensitive resist layer 130 patterned on a top surface of the first conductive layer 180 to form a second fine circuit pattern (FIGS. 6B and 6C). As described above, a tenting process or a panel/pattern process may be used as the subtractive method.

In the additive method, as briefly shown in FIGS. 7A-7D, plating is carried out using a fourth photosensitive resist layer 140 patterned on the first surface of the single layer PCB formed according to the first embodiment at which the first fine circuit pattern is not formed as a mask to form a second fine circuit pattern (FIGS. 7A and 7B), and the patterned fourth photosensitive resist layer 140 is removed to form a two layer PCB (FIG. 7C). As described above, an SAP, MSAP, AMSAP or FAP may be used as the additive method.

Next, surface protection treatment is performed with respect to at least one of the first surface of the substrate on which the first dielectric layer 160 is stacked and the grinded second surface of the PCB (S600) according to FIG. 8.

In the same manner as the first exemplary embodiment, the surface protection treatment is achieved by forming a patterned PSR 200 to at least one of the first and second surfaces of the PCB. The PSR pattern may be used as a plating resist so that plating is performed with respect to only a portion to be connected to another substrate or chip.

Also, when PCBs, each of which is manufactured using the manufacturing method according to the second exemplary embodiment, are bonded to form a multi layer board, the surface of a circuit layer may be black oxide processed to increase interlayer contact force with the dielectric layer 160, such as a prepreg.

In addition, when the second fine circuit pattern is formed (S500), it is preferable, but not necessary, to fully apply a fifth photosensitive resist 150 to the second surface of the substrate or PCB at which the first fine circuit pattern is formed to protect the first fine circuit pattern from an etching liquid used during formation of the second fine circuit as described above (FIGS. 6B, 7A and 7B).

The two layer PCB formed using the method according to the second exemplary embodiment is a coreless board having a thin thickness.

Third Exemplary Embodiment

According to a third exemplary embodiment, there is provided another method of manufacturing a two layer PCB in which circuit patterns are formed at both surfaces of the PCB.

Figure 9A:
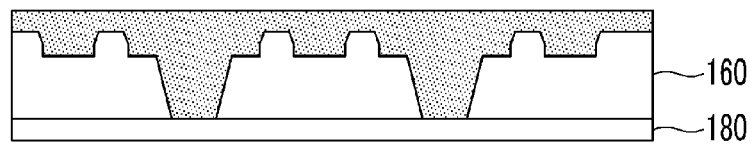
FIGS. 9A-9E illustrate another embodiment of the method of FIGS. 6A-6D.
Figure 9B:
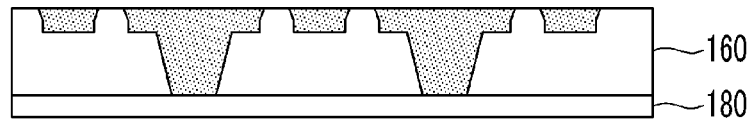
Figure 9C:
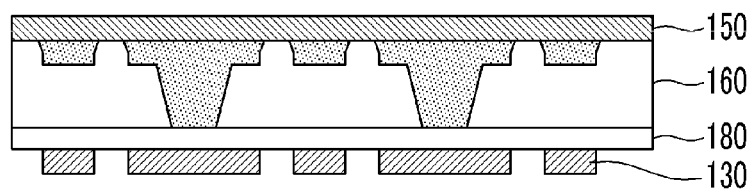
Figure 9D:
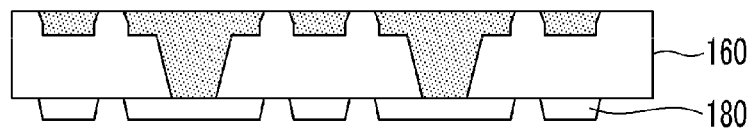
Figure 9E:
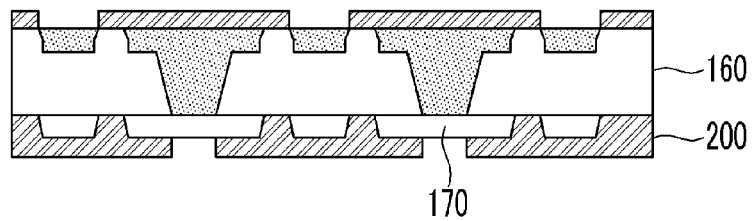
Figure 10:
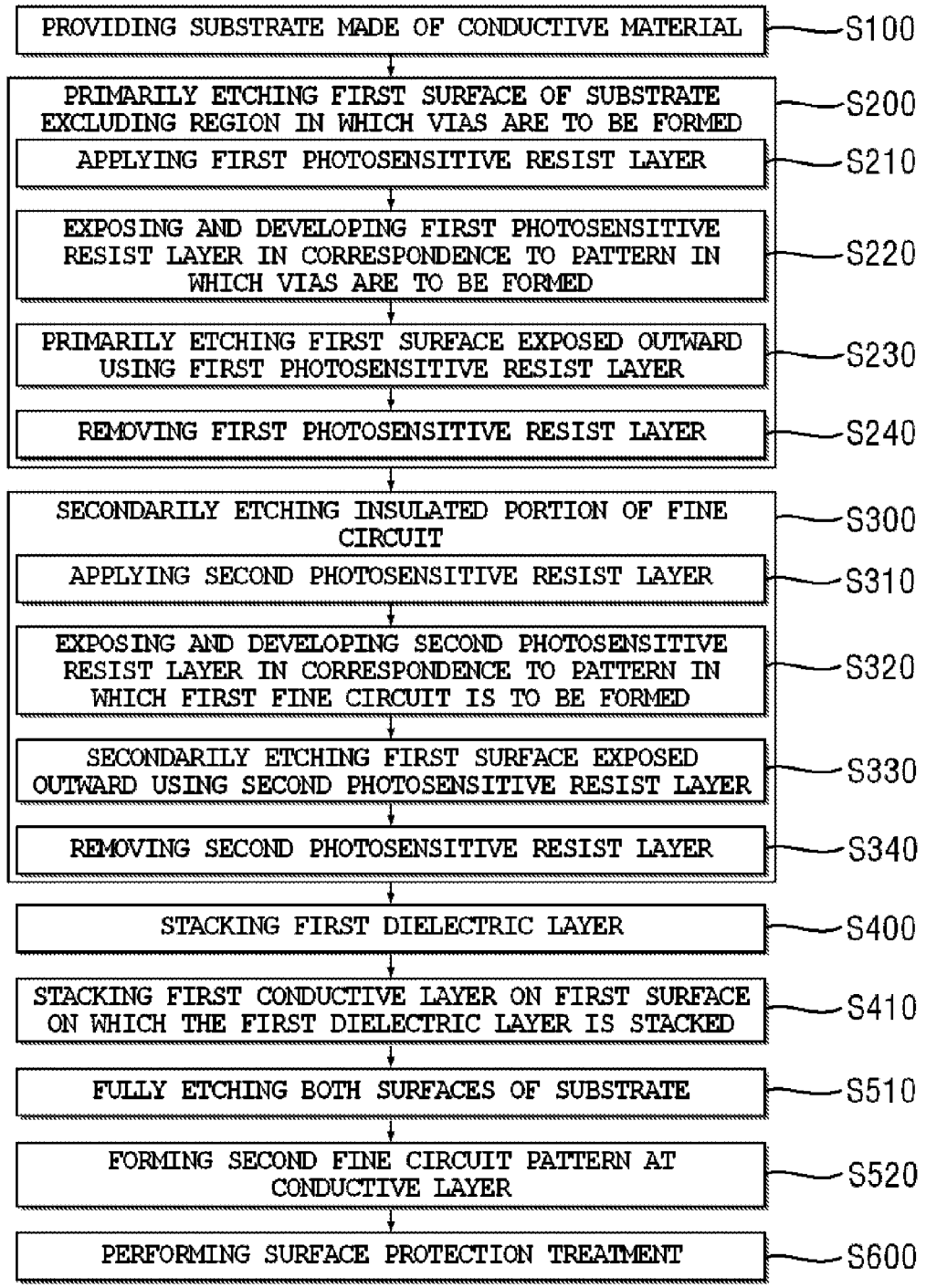
FIG. 10 is a flow chart showing the method of FIGS. 9A-9E.

FIG. 9A-9E illustrate another method of manufacturing the two layer PCB having vias and fine circuits according to the third exemplary embodiment based on the subtractive method, and FIG. 10 is a flow chart showing the method of FIGS. 9A-9E.

As shown in FIG. 10, the manufacturing method according to the third embodiment is identical to the manufacturing method according to the first embodiment up to operation S400 of stacking the first dielectric layer 160.

Thus, after operation S400, a first conductive layer 180 is stacked on the first surface of the substrate 100 on which the first dielectric layer 160 is stacked to form a second fine circuit layer on the same surface of the substrate 100 on which the first dielectric layer 160 is stacked (S410). Next, the first surface of the substrate 100 on which the first conductive layer 180 is stacked and the opposite surface thereof, i.e. both surfaces of the substrate, are fully etched (S510), and a second fine circuit pattern at the first conductive layer 180 are carried out to form a two layer PCB (S520).

Hereinafter, the operations added or changed to form the two layer PCB according to the third exemplary embodiment will be described with reference to FIGS. 9A-9E.

After stacking the first dielectric layer 160 (S400) in the first exemplary embodiment, a first conductive layer 180 is stacked on the first surface of the substrate 100 on which the first dielectric layer 160 is stacked to form a second fine circuit layer at the first surface opposite to the second surface of the substrate at which the first fine circuit layer is formed (S410).

That is, the first conductive layer 180 is further stacked before grinding the second surface of the substrate 100 to expose the insulated portion of the first fine circuit pattern in the first and second exemplary embodiments (FIG. 9A).

The first conductive layer 180 stacked on the substrate may be made of a conductive material, such as Au, Ag or Cu. Preferably but not necessarily, the first conductive layer 180 is made of Cu in terms of conductivity and productivity.

The first conductive layer 180 is formed by coating using a Cu film or direct plating. When the first conductive layer 180 is formed by coating using a Cu film, the surface of the first conductive layer 180 is preferably, but not necessarily, roughened (for example, black oxide processed) to increase interlayer contact force with the dielectric layer 160, such as a prepreg.

Next, fully etching both surfaces of the substrate 100 to form the two layer PCB according to the third exemplary embodiment is carried out (S510).

Unlike the second exemplary embodiment, both surfaces of the substrate 100 are fully etched without performing operation 500 of grinding the substrate 100 to form the first fine circuit pattern. In a case in which the thickness of the first conductive layer 180 stacked at operation S410 is not thin, both surfaces of the substrate 100 are fully etched to achieve the same effect as forming the first fine circuit pattern and stacking a thin first conductive layer 180.

Next, a second fine circuit pattern is formed at the first conductive layer 180 to form the two layer PCB (S520).

The second fine circuit pattern may be formed using a subtractive method, such as a tenting process or a panel/pattern process, or an additive method, such as an SAP, MSAP or AMSAP.

Unlike the second exemplary embodiment, however, the second fine circuit pattern is formed after a conductive layer is formed, and thus, a circuit formation method such as a FAP is not proper.

In the third exemplary embodiment, when the second fine circuit pattern is formed, it is preferable, but not necessary, to fully apply a fifth photosensitive resist 150 to the first surface of the substrate 100 at which the first fine circuit pattern is formed to protect the first fine circuit pattern from an etching liquid used during formation of the second fine circuit pattern as described above, in the same manner as in the second exemplary embodiment.

The two layer PCB formed using the method according to the third exemplary embodiment is a coreless board having a thin thickness.

Next, surface protection treatment is performed with respect to at least one of the first surface of the substrate on which the first dielectric layer 160 is stacked and the grinded second surface of the substrate (S600).

In the same manner as the first embodiment, the surface protection treatment is achieved by forming a patterned PSR 200. The PSR pattern may be used as a plating resist so that plating is performed with respect to only a portion to be connected to another substrate or chip.

Also, when PCBs, each of which is manufactured using the manufacturing method according to the present embodiment, are bonded to form a multi layer board, the surface of a circuit layer may be black oxide processed to increase interlayer contact force with the first dielectric layer 160, such as a prepreg.

Fourth Exemplary Embodiment

According to a fourth exemplary embodiment, there is provided a method of manufacturing a PCB having four circuit layers.

Figure 11A:
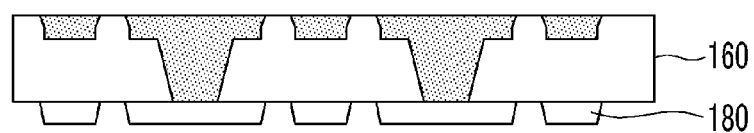
FIGS. 11A-11C and 12A-12C illustrate a method of manufacturing a four layer PCB having vias and a fine circuit according to a further exemplary embodiment.
Figure 11B:
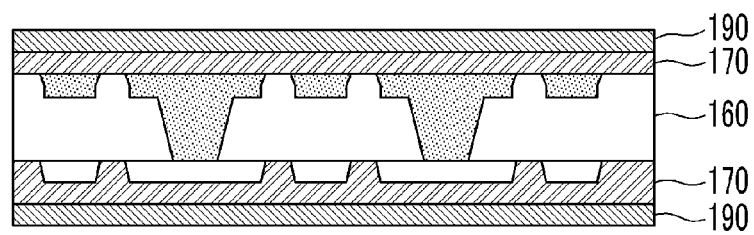
Figure 11C:
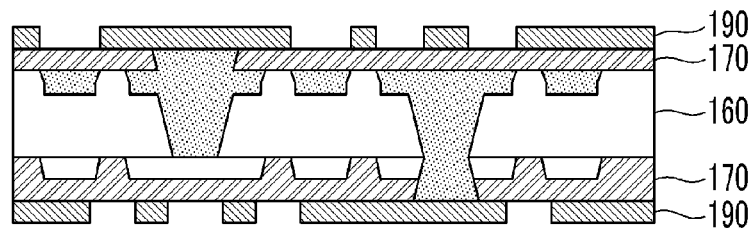
Figure 12A:
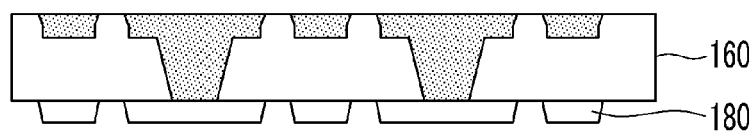
Figure 12B:
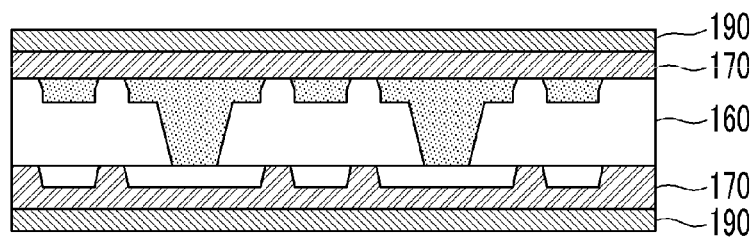
Figure 12C:
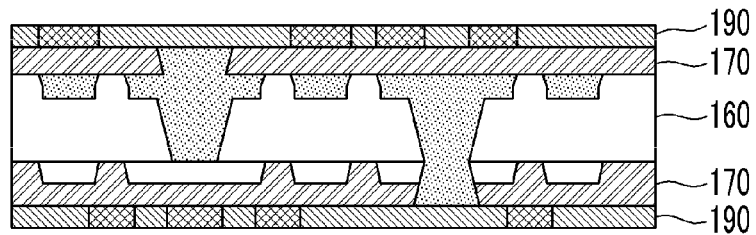
Figure 13:
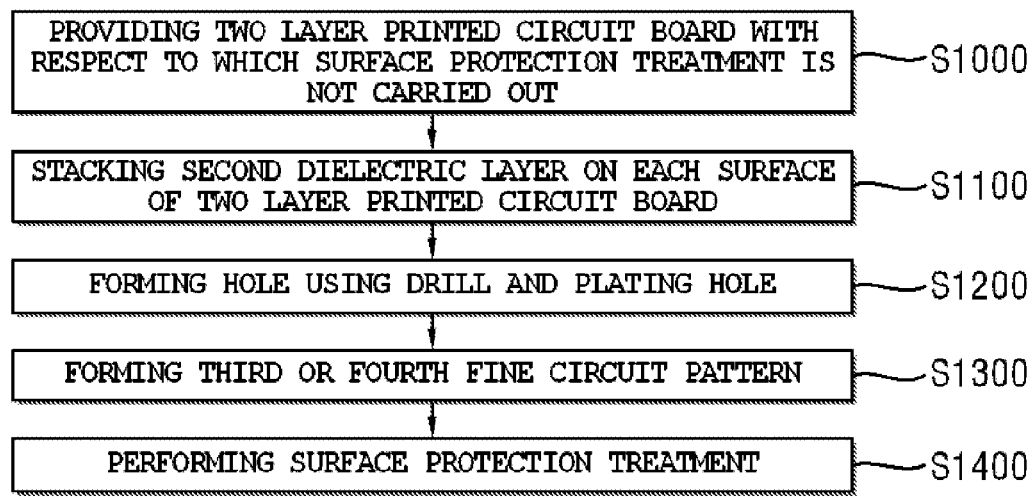
FIG. 13 is a flow chart showing the methods of FIGS. 11A-11C and 12A-12C.

FIGS. 11A-11C and 12A-12C illustrate a method of manufacturing a four layer PCB having vias and fine circuits according to the fourth exemplary embodiment, and FIG. 13 is a flow chart showing the methods of FIGS. 11A-11C and 12A-12C.

As shown in FIG. 13, the method of manufacturing the four layer PCB having the vias and the fine circuits according to the fourth exemplary embodiment includes an operation of providing a two layer PCB, formed using the manufacturing method according to the second or third exemplary embodiment, with respect to which surface protection treatment is not carried out (S1000). Next, a second dielectric layer 170 made of a dielectric material, such as a prepreg, is stacked on each surface of the two layer PCB (S1100), and a hole is formed in the second dielectric layer 170 using a mechanical drill or a laser drill and the interior of the hole is plated (S1200). Next, a third or fourth fine circuit pattern is formed at one surface or both surfaces of the PCB. The method of manufacturing the four layer PCB having the vias and the fine circuits according to the fourth exemplary embodiment may further include performing surface protection treatment.

First, as shown in FIGS. 11A and 12A, a two layer PCB, with respect to which surface protection treatment is not carried out, is provided (S1000), and the second dielectric layers 170 are stacked on both surfaces of the PCB (S1100) (FIGS. 11B and 12B). Next, one or more holes are formed in the second dielectric layer 170 using a mechanical drill or a laser drill, and the interior of the holes is plated to form one or more vias for a third or fourth fine circuit pattern.

Subsequently, the third or fourth fine circuit pattern is carried out using a subtractive method, such as a tenting process or a panel/pattern process (FIG. 11C) or an additive method, such as an SAP, MSAP, AMSAP or FAP (FIG. 12C), as described above.

In particular, when the third or fourth fine circuit pattern is formed using the subtractive method, the second dielectric layer 170 and a second conductive layer 190 are sequentially stacked as shown in FIG. 11B.

The second conductive layer 190 may be formed by coating using a Cu film or direct plating, as described above. When the second conductive layer 190 is formed by coating using a Cu film, the surface of the second conductive layer 190 is preferably, but not necessarily, roughened (for example, black oxide processed) to increase interlayer contact force with the second dielectric layer 170, such as a prepreg. Also, in a case in which it is not possible to form the second conductive layer 190 so that the thickness of the second conductive layer 190 is thin, the thick second conductive layer 190 is stacked, and then, both surfaces of the PCB are fully etched to achieve a thin second conductive layer 190.

Next, surface protection treatment is carried out with respect to at least one of the first and second surfaces of the four layer PCB (S1400).

In the same manner as the first exemplary embodiment, the surface protection treatment is achieved by forming a patterned PSR 200. The PSR pattern 200 may be used as a plating resist so that plating is performed with respect to only a portion to be connected to another substrate or chip.

Also, when PCBs, each of which is manufactured using the manufacturing method according to the fourth exemplary embodiment, are bonded to form a multi layer board, the surface of the circuit layer may be black oxide processed to increase interlayer contact force with the first dielectric layer 160 or the second dielectric layer 170, such as a prepreg.

In the method of manufacturing the PCB having the vias and the fine circuit according to the exemplary embodiments as described above, a Cu plating process is omitted during formation of the vias and the fine circuit according to the related art manufacturing method, and thus, it may be possible to prevent the occurrence of defects caused during filling of Cu in a lump at the Cu plating process.

Also, in the method of manufacturing the PCB having the vias and the fine circuit according to the exemplary embodiments, a dielectric layer is made of a prepreg, and thus, it is possible to manufacture a coreless board having a thin thickness.

Also, in the method of manufacturing the PCB having the vias and the fine circuit according to the exemplary embodiments, a circuit pattern formed at the dielectric layer is a buried pattern, and a coreless board is manufactured. Consequently, it may be possible to manufacture a PCB having a thin thickness even when a multi layer PCB, for example a two or more layer PCB, is realized.

Also, in the method of manufacturing the PCB having the vias and the fine circuit according to the exemplary embodiments, a process for forming a via hole is omitted, and thus, it is possible to prevent the occurrence of a problem caused during filling the via hole with a conductive material.

Also, in the method of manufacturing the PCB having the vias and the fine circuit according to the exemplary embodiments, a double substrate, in which two substrates are bonded in a state in which an additional separable film is disposed between the substrates, is used before a dielectric layer is stacked, i.e. before a planarization process is carried out. Consequently, it may be possible to improve productivity and to reduce manufacturing costs.

Although the exemplary embodiments have been disclosed for illustrative purposes, those skilled in the art will appreciate that various modifications, additions and substitutions are possible, without departing from the scope and spirit of the inventive concept as disclosed in the accompanying claims.

What is claimed is:

1. A method of manufacturing a circuit board, the method comprising:
    (a) providing a substrate made of a conductive material;
    (b) etching a first surface of the substrate excluding a region in which at least one via is to be formed;
    (c) etching the etched surface of the etched first surface of the substrate in which an insulated portion of a first circuit pattern is to be formed;
    (d) stacking a first insulation layer in spaces formed by the etching performed in operations (b) and (c); and
    (e) grinding a second surface of the substrate to expose the first insulation layer outward along with the first circuit pattern, thereby forming a circuit board.

2. The method according to claim 1, wherein operation (b) comprises:
    (b1) applying a first photosensitive resist layer to the first surface of the substrate;
    (b2) exposing and developing the first photosensitive resist layer in which the at least one via is to be formed; and
    (b3) etching the first surface using the first photosensitive resist layer.

3. The method according to claim 2, wherein operation (b) further comprises:
    (b4) removing the first photosensitive resist layer, and wherein operation (c) comprises:
    (c1) applying a second photosensitive resist layer to the etched first surface of the substrate;
    (c2) exposing and developing the second photosensitive resist layer in which the first circuit pattern is to be formed; and
    (c3) etching the etched first surface using the second photosensitive resist layer.

4. The method according to claim 3, wherein, at operation (c1), the second photosensitive resist layer is formed of a dry film resist (DFR) or an electric deposit photo resist (EDPR).

5. The method according to claim 3, wherein, at operation (c2), the second photosensitive resist layer is exposed using a laser direct image (LDI).

6. The method according to claim 3, wherein operation (c) further comprises:
    (c4) removing the second photosensitive resist layer, and wherein the method further comprising:
    (f) forming a second circuit pattern on the first surface of the substrate where the first insulation layer is stacked in the spaces formed by the etching performed in operations (b) and (c).

7. The method according to claim 1, wherein, at operation (d), the first insulation layer is formed of a prepreg.

8. The method according to claim 1, further comprising:
    (f) forming a second circuit pattern on the first surface of the substrate where the first insulation layer is stacked in the spaces formed by the etching performed in operations (b) and (c).

9. The method according to claim 8, wherein, at operation (f), the second circuit pattern is formed using any one selected from a group consisting of a tenting process, a panel/pattern process, a semi additive process, a modified semi additive process, an advanced modified semi additive process, and a full additive process.

10. The method according to claim 8, wherein operation (f) comprises fully forming a fifth photosensitive resist on the first surface of the substrate at which the first circuit pattern is formed before the second circuit pattern is formed.

11. The method according to claim 8, further comprising:
(g) stacking a second insulation layer on at least one of the first surface on which the second circuit pattern is formed and the second surface grinded in operation (e);
(h) forming a third circuit pattern on at least one of the first and second surfaces after operation (g).

12. The method according to claim 11, wherein, in operation (h), the third circuit pattern is connected to the conductive material of the substrate.

13. The method according to claim 1, wherein the circuit board and at least one another circuit board having the same structure are bonded to form a multi layer circuit board.

14. The method according to claim 1, further comprising:
(f) performing surface protection treatment with respect to at least one of the first surface where the first insulation layer is stacked in the spaces formed by the etching performed in operations (b) and (c), and the second surface.

15. A method of manufacturing a circuit board, the method comprising:
(a) providing a substrate made of a conductive material;
(b) etching a first surface of the substrate excluding a region in which at least one via is to be formed;
(c) etching a region of the etched first surface of the substrate in which an insulated portion of a first circuit pattern is to be formed;
(d) stacking a first insulation layer in spaces formed by the etching performed in operations (b) and (c);
(e) stacking a first conductive layer on the first surface of the substrate after operation (d);
(f) etching the first and second surfaces of the substrate after operation (e) so that the first insulation layer is exposed outward along with the first circuit pattern; and
(g) forming a second circuit pattern at the first conductive layer.

16. The method according to claim 15, wherein, in operation (g), the second circuit pattern is formed using any one selected from a group consisting of a tenting process, a panel/pattern process, a semi additive process, a modified semi additive process, an advanced modified semi additive process, and a full additive process.

17. The method according to claim 15, wherein the step (g) comprises fully forming a fifth photosensitive resist on the first surface of the substrate at which the first circuit pattern is formed before the second circuit pattern is formed.

* * * * *